(12) United States Patent
Kee et al.

(10) Patent No.: US 7,834,537 B2
(45) Date of Patent: Nov. 16, 2010

(54) SEAMLESS FOLDABLE DISPLAY DEVICE

(75) Inventors: In-Seo Kee, Seongnam-si (KR);
Hong-shik Shim, Seoul (KR);
Jung-Woo Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 984 days.

(21) Appl. No.: 11/538,621

(22) Filed: Oct. 4, 2006

(65) Prior Publication Data

US 2007/0262916 A1 Nov. 15, 2007

(30) Foreign Application Priority Data

May 9, 2006 (KR) .................... 10-2006-0041638

(51) Int. Cl.
*H05B 33/00* (2006.01)
*H05B 33/02* (2006.01)
*G09G 3/32* (2006.01)

(52) U.S. Cl. .................. 313/500; 313/504; 313/505; 362/616

(58) Field of Classification Search ............ None
See application file for complete search history.

(56) References Cited

U.S. PATENT DOCUMENTS

2006/0033422 A1* 2/2006 Chao et al. ............ 313/500

2006/0186316 A1* 8/2006 Miyashita et al. ........ 250/208.1

FOREIGN PATENT DOCUMENTS

| EP | 0 389 744 A1 | 10/1990 |
| JP | 2003022037 | 1/2004 |
| WO | 02/42838 A1 | 5/2002 |
| WO | 03/052825 A1 | 6/2003 |

OTHER PUBLICATIONS

Yasunori, Japanese Application Publication, 2003-022037., Jan. 2006, machine translation.*
European Search Report for Application No. 07104958.9-2205; Dated: Aug. 20, 2007, and citing all of the (4) references disclosed herein.

* cited by examiner

*Primary Examiner*—Sikha Roy
*Assistant Examiner*—Tracie Green
(74) *Attorney, Agent, or Firm*—Cantor Colburn LLP

(57) ABSTRACT

A foldable display device is designed so that a junction between at least two display panels connected to each other is not visibly seen. The display device displays an image on a plurality of display panels that are connected together. Pixels near the junction between every two adjacent display panels of the at least two display panels are smaller and have a higher brightness than the other pixels.

11 Claims, 6 Drawing Sheets

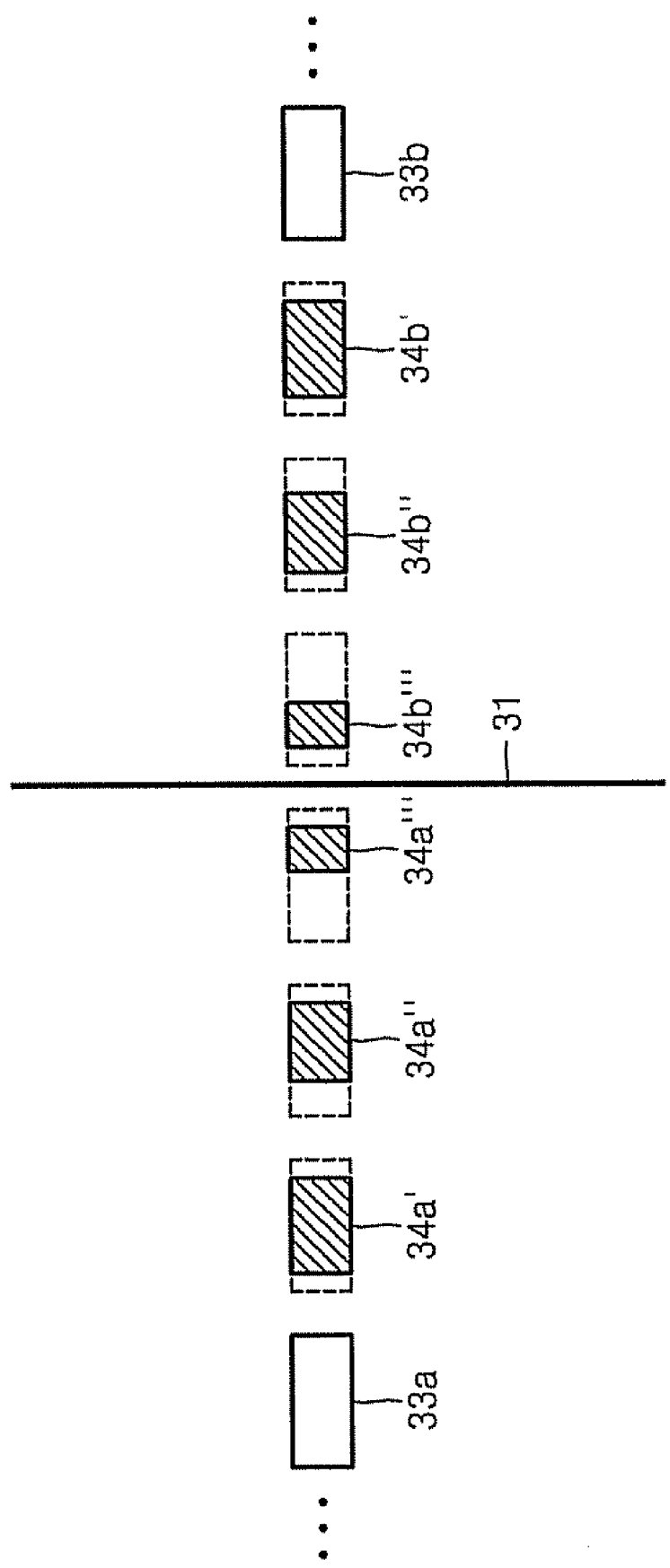

SEAMLESS FOLDABLE DISPLAY DEVICE

This application claims priority to Korean Patent Application No. 10-2006-0041638, filed on May 9, 2006, and all the benefits accruing therefrom under 35 U.S.C. §119, the contents of which in its entirety are herein incorporated by reference.

BACKGROUND OF THE INVENTION

1. Field of the Invention

The present invention relates to a foldable display device, and more particularly, to a foldable display device having a junction between at least two display panels connected to each other which is not visibly noticeable.

2. Description of the Related Art

As mobile multimedia broadcasting services, such as, digital multimedia broadcasting, is increasingly being provided, the necessity of enlarging a display panel of a portable display device, such as, a compact mobile device (e.g., a mobile phone) or a portable multimedia player ("PMP"), is increasing. However, the enlargement of the display panel greatly decreases the portability of the portable display device.

To solve this problem, a foldable display device including two display panels 10a and 10b which are pivotally coupled to each other so that the foldable display device may be folded while being carried has been proposed, which is illustrated in FIG. 1. However, two pixels 12a and 12b located at junction parts of the display panels 10a and 10b, respectively, are separated by about 1 mm, so that a black stripe B appears between images displayed on the two display panels 10a and 10b. In order to minimize a thickness of the black stripe B, the distance between the pixels 12a and 12b at junction parts of the display panels 10a and 10b needs to be minimized. The thicknesses of barrier walls 11a and 11b for completely shielding the pixels within the display panels 10a and 10b from the outside hinder sufficient minimization of the distance between the pixels 12a and 12b. This problem not only occurs in portable foldable display devices but also in large-sized display devices that have large screens obtained by connecting a plurality of small display panels together.

To address this problem, a technique of providing a continuous image by removing a black stripe without reducing the distance between the pixels 12a and 12b installed on the junction parts of the display panels 10a and 10b has been proposed. FIG. 2 illustrates a conventional display device having two display panels between which there are no seams. Referring to FIG. 2, the display panels 20a and 20b are coupled to each other by a junction part 21. To optically compensate for the seam between the two display panels 20a and 20b, electrodes 25 near the junction part 21 are made smaller than electrodes 24 in the other parts. To magnify the images on the smaller electrodes 25, a convex optical lens 23 is installed over the smaller electrodes 25. On the other hand, a flat glass or optical lens 22 is installed over the larger electrodes 24. Backlight units 26a and 26b for illuminating the display panels 20a and 20b, respectively, may be designed so as to provide brighter light to the smaller electrodes 25 than to the larger electrodes 24.

However, because the conventional display device of FIG. 2 requires the extra optical lens 23, the number of components thereof increases, leading to increases in the manufacturing time and costs thereof. Also, if the curvatures of the optical lens 23 is not precisely designed, an image may be distorted due to, for example, aberration. In addition, the precision design of the optical lens 23 increases the manufacturing costs greatly. Moreover, it is difficult to design the backlight units 26a and 26b for providing brighter light to a specific area, namely, to the smaller electrodes 25 than to the larger electrodes 24, and the design of the backlight units also increases the manufacturing costs. Furthermore, the backlight units 26a and 26b can hardly control the brightness of the specific area with any precision.

BRIEF SUMMARY OF THE INVENTION

The present invention provides a foldable display device which makes a junction between at least two display panels connected to each other invisible, using a method that does not require additional components and is thus simple and cost-effective compared to conventional methods.

According to an aspect of the present invention, a display device is provided for displaying an image on a plurality of display panels that are connected together, wherein pixels near a junction between every two adjacent display panels of the display panels are smaller than the other pixels and the smaller pixels near the junction between the every two adjacent display panels have a higher brightness than the other pixels.

In an exemplary embodiment of the present invention, two facing pixels on both sides of the junction between the every two adjacent display panels may serve as independent pixels.

In this exemplary embodiment, when vertical pixel lines of the every two adjacent display panels are divided into continuous areas having identical widths, a single pixel may be located in each of the areas.

In this exemplary embodiment, pixels in at least two pixel columns may gradually increase in a direction going from the junction of the every two adjacent display panels to each of the center portions of the every two adjacent display panels.

In this exemplary embodiment, the intensity of light emitted from one of the pixels near the junction of the every two adjacent display panels is equal to the intensity of light emitted from one of the other pixels.

In another exemplary embodiment of the present invention, two facing pixels on both sides of the junction between the every two adjacent display panels may serve as a single pixel.

In this exemplary embodiment, when vertical pixel lines of the two adjacent display panels are divided into continuous areas having identical widths, the two pixels on both sides of the junction are located together in one area, and the other pixels are arranged in such a manner that one pixel is located in one area.

In this exemplary embodiment, the sum of the intensities of lights emitted from the two pixels on both sides of the junction is equal to the intensity of light emitted from one of the other pixels.

In the present invention, the display panels are emissive display panels.

The display panels may be one of an organic electroluminescent light emitting device ("OLED"), a field emission display ("FED"), a plasma display panel ("PDP"), and an inorganic electroluminsecence ("EL") device.

The junction between the every two neighboring display panels may include a hinge to allow the every two neighboring display panels to be folded one over the other.

The distance between the pixels on both sides of the junction between the every two adjacent display panels may be in the range of about 0.1 mm to about 1 mm.

An array of pixels that display a red color (R), a green color (G) and a blue color (B) may be repeated in a direction substantially parallel to a lengthwise direction of the junction.

According to another aspect of the present invention, a method for displaying an image on a plurality of display panels connected together is provided. The method includes: disposing pixels near a junction between every two adjacent display panels of the plurality of display panels being smaller than the other pixels; and illuminating the smaller pixels near the junction between the every two adjacent display panels to have a higher brightness than the other pixels.

BRIEF DESCRIPTION OF THE DRAWINGS

The above and other aspects, features and advantages of the present invention will become more apparent by describing in more detail exemplary embodiments thereof with reference to the attached drawings in which:

FIG. 6 is a block diagram illustrating a configuration of pixels that is employed in a seamless foldable display device according to another exemplary embodiment of the present invention so as to make a seam invisible.

DETAILED DESCRIPTION OF THE INVENTION

Figure 1:
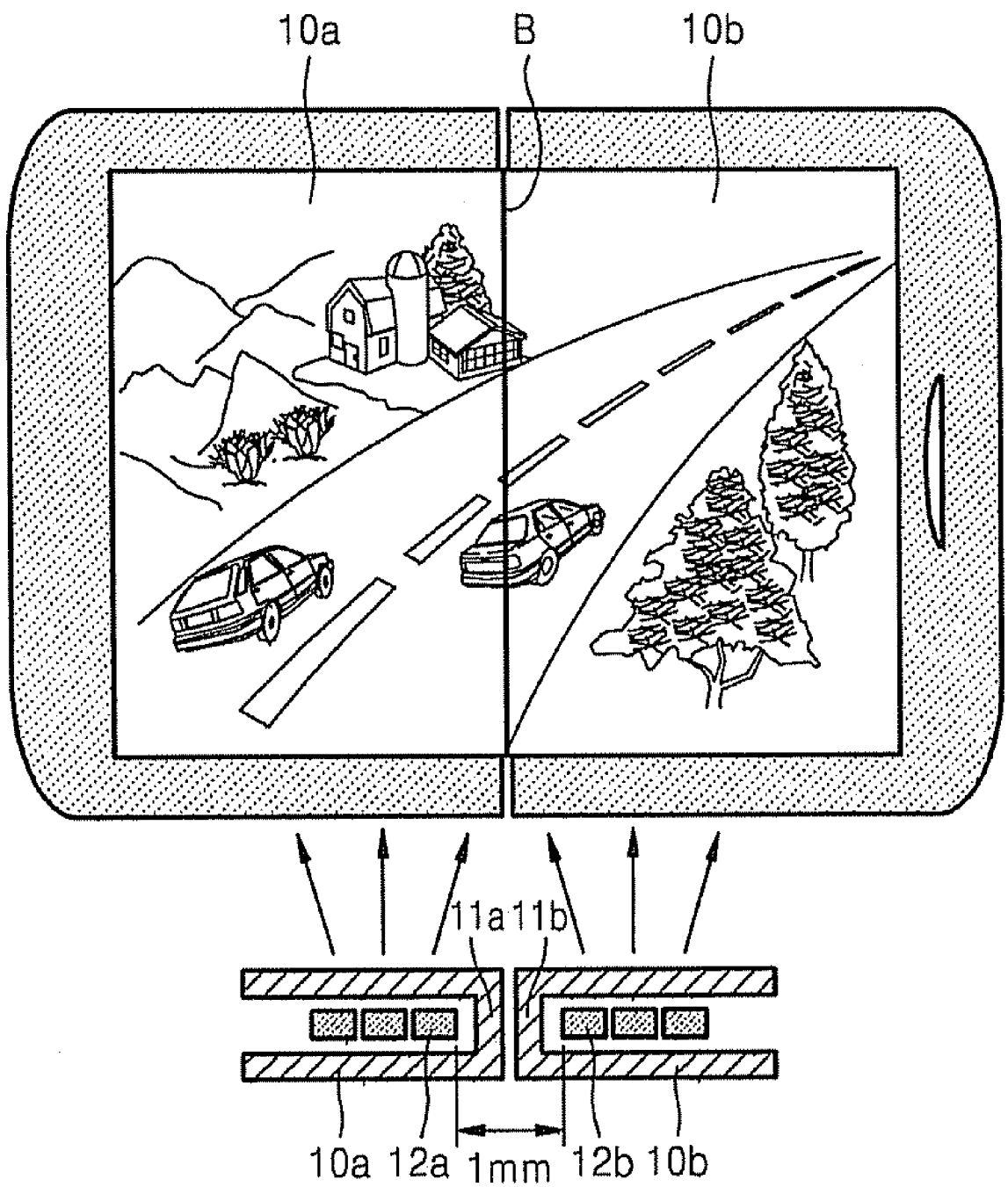
FIG. 1 is a plan view and a partial cross-sectional view illustrating a conventional foldable display device.
Figure 2:
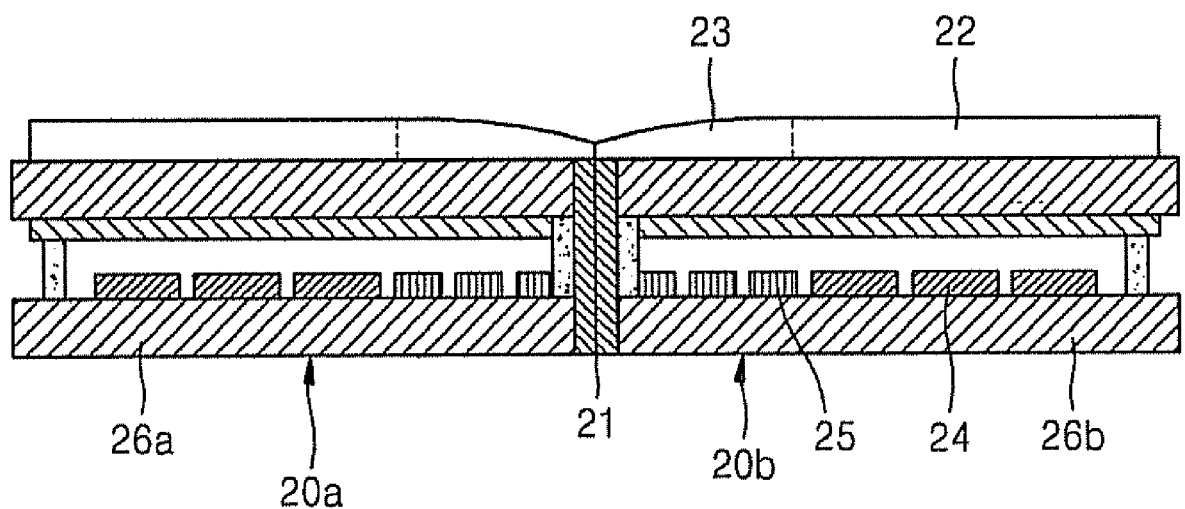
FIG. 2 is a cross-sectional view illustrating another conventional foldable display device.
Figure 3:
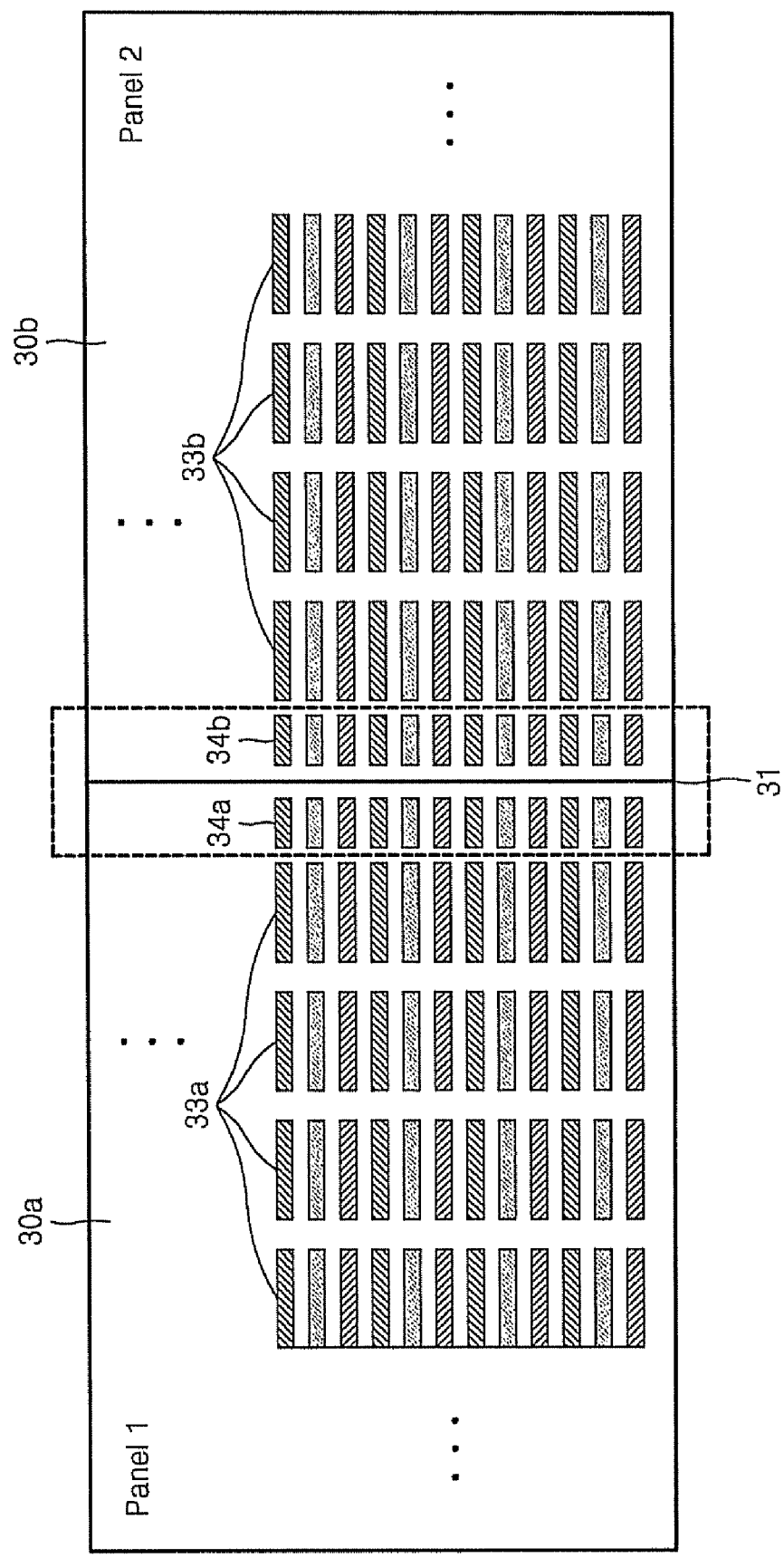
FIG. 3 is a block diagram illustrating a configuration of pixels employed in a seamless foldable display device according to an exemplary embodiment of the present invention so as to make a seam invisible.

FIG. 3 is a block diagram illustrating a configuration of pixels of a seamless foldable display device according to an exemplary embodiment of the present invention for displaying a single image on a plurality of display panels that are connected together.

As illustrated in FIG. 3, the seamless foldable display device includes two display panels 30a and 30b which are connected together. Although only the two display panels 30a and 30b are illustrated in FIG. 3, more than two display panels may be included in the seamless foldable display device. The principle according to the present invention is equally applied to this case. In the present exemplary embodiment, pixels 34a and 34b adjacent to a junction 31 between the two display panels 30a and 30b among the pixels arranged on the two display panels 30a and 30b are formed to be smaller than the other pixels 33a and 33b. The smaller size of the pixels 34a and 34b are offset by controlling the pixels 34a and 34b to have a higher brightness than the pixels 33a and 33b. If an array of a red (R) pixel, a green (G) pixel and a blue (B) pixel are repeated in the horizontal direction, specific color pixels may be small. To prevent this problem, an array of R, G and B pixels is preferably repeated in a lengthwise direction of the junction 31, that is, in the vertical direction as illustrated in FIG. 3.

The junction 31 may be simply formed of an adhesive material that joins the two display panels 30a and 30b together. However, the two neighboring display panels 30a and 30b may be designed to be folded one over the other by, for example, a hinge. In this case, a display device according to the present invention may be used as a portable foldable display device that can be transported with the two display panels being folded against one another to minimize the size of the display device, thus facilitating portability.

In the present exemplary embodiment, the display panels 30a and 30b are emissive display panels that do not use backlight units. Examples of the display panels 30a and 30b include an organic electroluminescent light emitting device ("OLED"), a field emission display ("FED"), a plasma display panel ("PDP"), an inorganic electroluminsecence ("EL") device, etc. In the present invention, since emissive display panels are used as the display panels 30a and 30b, the brightnesses of only specific pixels can be precisely increased to desired levels simply by increasing the duration or intensity of an applied voltage to only those specific pixels.

Figure 4A:
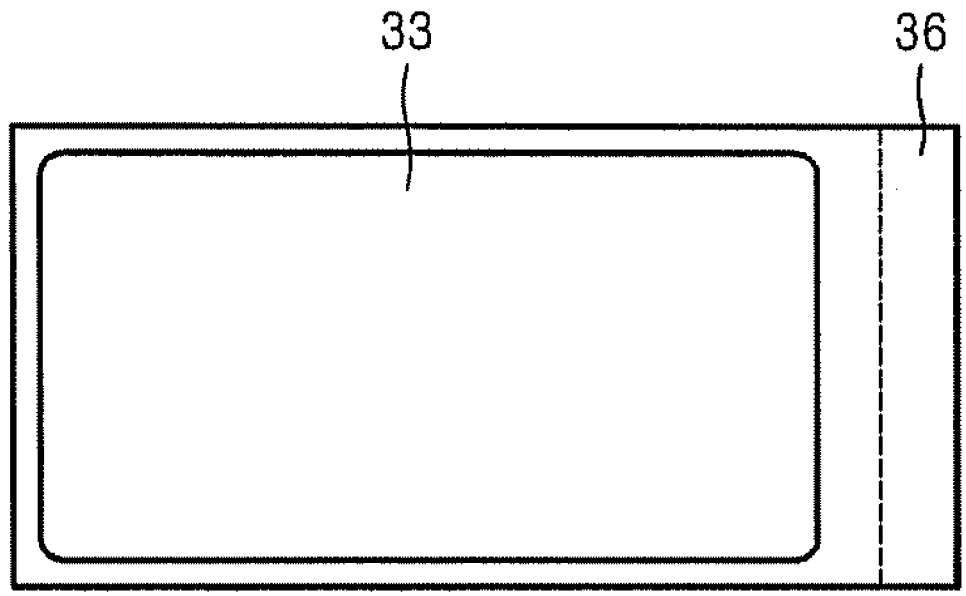
FIG. 4A is a block diagram illustrating an edge structure of a display panel that uses a pixel having a general length.
Figure 4B:
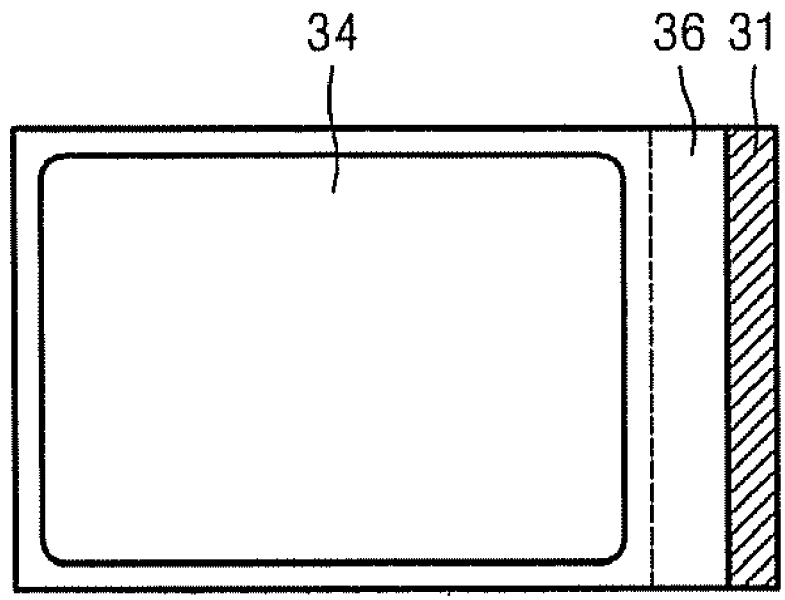
FIG. 4B is a block diagram illustrating an edge structure of a display panel that uses a pixel having a short length.

As illustrated in FIG. 3, the distance between the pixels 34a and 34b adjacent to the junction 31 between the two display panels 30a and 30b can be reduced by decreasing the sizes of the pixels 34a and 34b. As illustrated in FIG. 4A, in an edge of a display panel that uses a pixel 33 having a general or standard length, the junction 31 of FIG. 3 should be formed on the outer side of a barrier wall 36 for protecting the pixel 33. Here, the distance between the pixel 33 and the barrier rib 36, the thickness of the barrier wall 36, and the structure and thickness of the junction 31 determine the distance between the pixels 34a and 34b on both sides of the junction 31. As illustrated in FIG. 4B, when the pixel on the edge of the display panel is shortened into a pixel 34, the distance between the pixel 34 and the barrier wall 36 can be shortened by the reduced length of the pixel. In addition, in the present invention, the overall thickness of the barrier wall 36 and the junction 31 can be reduced by integrally forming the barrier wall 36 and the junction 31.

In this case, the distance between the pixels 34a and 34b near the junction 31 between the two display panels 30a and 30b may be in the range of about 0.1 mm to about 1 mm. In general, when the distance between two points is 0.1 mm, the two points appear as a single point at a distance of 40 cm or more. Hence, when the distance between the pixels 34a and 34b is in the range of about 0.1 mm to about 1 mm, a black stripe between images displayed on the two display panels 30a and 30b may be hardly seen.

Figure 5A:
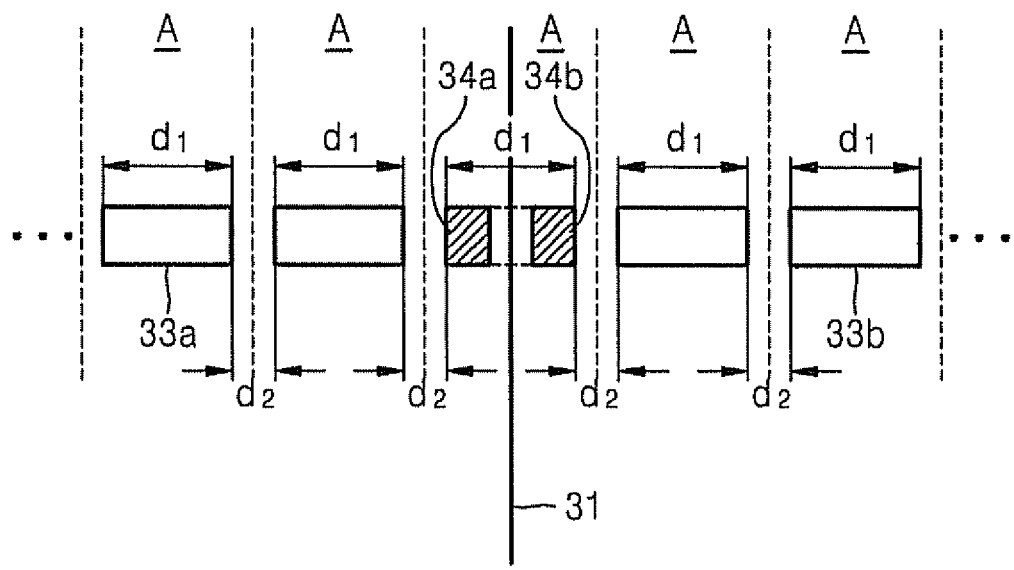
FIGS. 5A and 5B are block diagrams illustrating different configurations of pixels in the foldable display device of FIG. 3.
Figure 5B:
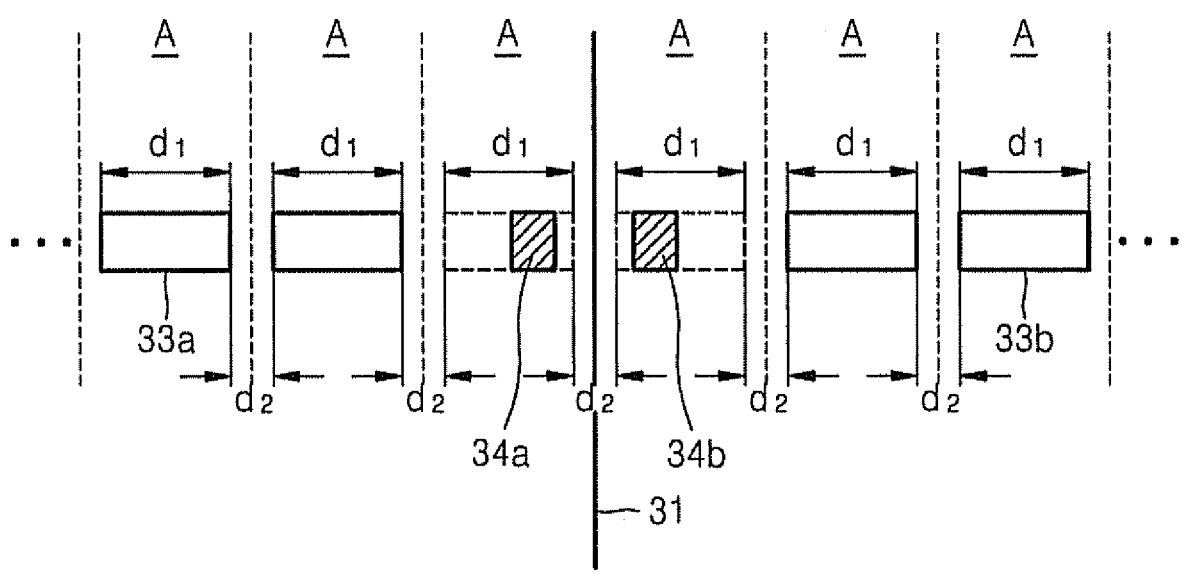

FIGS. 5A and 5B illustrate configurations of pixels of a display device according to the present invention that help allow a black stripe between the two display panels 30a and 30b to be more invisible and two images displayed on the two display panels 30a and 30b to be smoothly connected to each other.

In the case of FIG. 5A, the two pixels 34a and 34b facing each other on both sides of the junction 31 of the two display panels 30a and 30b serve as a single pixel. In other words, the two pixels 34a and 34b are controlled to display the same image data at all times. As illustrated in FIG. 5A, when vertical pixel lines of the two adjacent display panels 30a and 30b are divided into continuous areas A having identical widths, the two pixels 34a and 34b on both sides of the junction 31 are located together in one area, and the other pixels 33a and 33b are arranged in such a manner that one pixel is located in one area A. In this case, the sum of the intensities of lights emitted from the two pixels 34a and 34b together is controlled to be equal to the intensity of light emitted from each of the pixels 33a and 33b. For example, if the sum of the sizes of the pixels 34a and 34b is ⅔ of the size of a pixel 33a or 33b other than the pixels 34a and 34b, the sum of the intensities of light emitted from the two pixels 34a and 34b is controlled to be ³⁄₂ of the brightness of the pixel 33a or 33b other than the pixels 34a and 34b. By doing this, the pixels 33a, 33b and 34a/34b of the display panels 30a and 30b look to be consecutively arranged at regular intervals.

Accordingly, a black stripe generated due to the junction 31 can be minimized, and images displayed on both sides can be smoothly connected to each other.

In the case of FIG. 5B, the two pixels 34a and 34b facing each other on both sides of the junction 31 of the two display panels 30a and 30b serve as independent pixels in respective areas A. In other words, the two pixels 34a and 34b are controlled to display different image data independently. As illustrated in FIG. 5B, when vertical pixel lines of the two adjacent display panels 30a and 30b are divided into continuous areas A having identical widths, a single pixel is located in each of the areas A. Accordingly, the two pixels 34a and 34b smaller than the other pixels 33a and 33b are located in different areas A like the other pixels 33a and 33b arranged in such a manner that one pixel is located in one area A. In this case, the intensity of light emitted from each of the two pixels 34a and 34b is controlled to be equal to the intensity of light emitted from each of the pixels 33a and 33b. For example, if the size of one of the pixels 34a and 34b is ½ of the size of a pixel other than the pixels 34a and 34b, the intensity of light emitted from one of the two pixels 34a and 34b is controlled to be twice the brightness of the pixel 33a or 33b other than the pixels 34a and 34b. By doing this, the pixels of the display panels 30a and 30b look to be consecutively arranged at regular intervals. Accordingly, a black stripe generated due to the junction 31 can be minimized, and images displayed on both sides can be smoothly connected to each other.

In the exemplary embodiments of FIGS. 5A and 5B, only the pixels 34a and 34b on both sides of the junction 31 among the pixels arranged on the two display panels 30a and 30b are made smaller. However, as in the exemplary embodiment of FIG. 6, pixels 34a', 34a'', 34a''', 34b', 34b'' and 34b''' in a plurality of columns may gradually increase in a direction away from the junction 31 between the display panels 30a and 30b to the center portions of the display panels 30a and 30b. Even in this case, as illustrated in FIG. 5B, all of the pixels of the display panels 30a and 30b may serve as independent pixels regardless of the sizes of the pixels. In addition, when vertical pixel lines of the two adjacent display panels 30a and 30b are divided into continuous areas A having identical widths, a single pixel is located in each of the areas A regardless of the different sizes of the pixels. In this case, the intensities of lights emitted from all of the pixels are controlled to be identical with one another regardless of the sizes of the pixels.

As described above, a display device for displaying an image on a plurality of display panels connected together according to the present invention is capable of effectively preventing or substantially reducing a black stripe associated with a junction between two adjacent display panels, thus making the junction invisible using a simple method. In other words, in contrast with conventional display devices, the display device according to the present invention requires no special optical lenses. In addition, the display device according to the present invention uses self-luminant display panels, so that the brightness of specific pixels can be easily controlled to desired levels. Therefore, a reduction of the sizes of pixels can be easily compensated for, and a complicated change of design of a backlight unit is not needed. Furthermore, the size of the junction between the two display panels can be reduced, and accordingly the distance between two facing pixels on both sides of the junction can be reduced. Therefore, discontinuity of an image due to the junction hardly occurs compared with conventional display devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device for displaying an image on a plurality of display panels connected together, wherein pixels near a junction between every two adjacent display panels of the plurality of display panels are smaller than the other pixels and the smaller pixels near the junction between the every two adjacent display panels have a higher brightness than the other pixels, wherein pixels in at least two adjacent pixel columns are smaller than remaining pixels and pixels in the at least two pixel columns gradually increase in size in a direction going from the junction of the every two adjacent display panels to each of the respective center portions of the every two adjacent display panels.

2. The display device of claim 1, wherein a width of a pixel column is uniform throughout the plurality of display panels, and wherein distances between the smaller pixels and the other pixels adjacent thereto are adjusted such that a distance between centers of the smaller pixels and a center of their respective pixel column increases with proximity to the junction.

3. The display device of claim 1, wherein an intensity of light emitted from one of the pixels near the junction of the every two adjacent display panels is equal to an intensity of light emitted from one of the other pixels.

4. The display device of claim 1, wherein two facing pixels on both sides of the junction between the every two adjacent display panels serve as a single pixel.

5. The display device of claim 4, wherein the sum of intensities of light emitted from the two pixels on both sides of the junction is equal to an intensity of light emitted from one of the other pixels.

6. The display device of claim 1, wherein the display panels are emissive display panels.

7. The display device of claim 6, wherein the display panels are one of an organic electroluminescent light emitting device (OLED), a field emission display (FED), a plasma display panel (PDP) and an inorganic electroluminsecence (EL) device.

8. The display device of claim 1, wherein an array of pixels that display a red color (R), a green color (G), and a blue color (B) is repeated in a direction substantially parallel to a lengthwise direction of the junction.

9. The display device of claim 1, wherein the pixels near the junction between every two adjacent display panels are arranged such that a distance between the pixels near the junction and the other pixels is larger than a distance between the other pixels.

10. The display device of claim 1, wherein a width between opposite ends of two pixels near the junction between every two adjacent display panels is equal to a width of the other pixels.

11. The display device of claim 1, wherein a distance between the pixels on both sides of the junction between the every two adjacent display panels is in a range of about 0.1 mm to about 1 mm.

* * * * *